(12) United States Patent
Ponoth et al.

(10) Patent No.: US 7,341,948 B2
(45) Date of Patent: Mar. 11, 2008

(54) METHOD OF MAKING A SEMICONDUCTOR STRUCTURE WITH A PLATING ENHANCEMENT LAYER

(75) Inventors: Shom Ponoth, Fishkill, NY (US); Steven Shyng-Tsong Chen, Patterson, NY (US); John Anthony Fitzsimmons, Poughkeepsie, NY (US); Terry Allen Spooner, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/306,930

(22) Filed: Jan. 17, 2006

(65) Prior Publication Data

US 2007/0166996 A1 Jul. 19, 2007

(51) Int. Cl.
*H01L 21/44* (2006.01)

(52) U.S. Cl. .................. 438/687; 438/679; 438/681; 257/E21.17; 257/E21.304; 257/E21.01

(58) Field of Classification Search ............ 438/687, 438/678, 679, 680, 681, 692, 700, 712
See application file for complete search history.

(56) References Cited

U.S. PATENT DOCUMENTS

| | | | | |
|---|---|---|---|---|
| 4,675,468 A | | 6/1987 | Basol et al. ............. | 297/256 |
| 4,977,013 A | * | 12/1990 | Ritchie et al. ........... | 428/212 |
| 5,280,381 A | | 1/1994 | Mason .................... | 359/268 |
| 5,969,422 A | * | 10/1999 | Ting et al. .............. | 257/762 |
| 6,077,780 A | * | 6/2000 | Dubin .................... | 438/687 |
| 6,162,365 A | | 12/2000 | Bhatt et al. ............. | 216/13 |
| 6,197,688 B1 | * | 3/2001 | Simpson ................. | 438/678 |
| 6,638,410 B2 | | 10/2003 | Chen et al. ............. | 205/182 |
| 6,787,441 B1 | | 9/2004 | Koh et al. ............... | 438/608 |
| 6,885,425 B2 | | 4/2005 | French et al. ........... | 394/147 |

OTHER PUBLICATIONS

"Criteria for Choosing Transparent Conductors," by Roy G. Gordon, www.mrs.org/publications/bulletin, Aug. 2000, pp. 52-57.

* cited by examiner

*Primary Examiner*—David Nhu
(74) *Attorney, Agent, or Firm*—Ira D. Blecker; Wenjie Li

(57) ABSTRACT

Disclosed is a method of making a semiconductor structure, wherein the method includes forming an interlayer dielectric (ILD) layer on a semiconductor layer, forming a conductive plating enhancement layer (PEL) on the ILD, patterning the ILD and PEL, depositing a seed layer into the pattern formed by the ILD and PEL, and then plating copper on the seed layer. The PEL serves to decrease the resistance across the wafer so to facilitate the plating of the copper. The PEL preferably is an optically transparent and conductive layer.

20 Claims, 4 Drawing Sheets

METHOD OF MAKING A SEMICONDUCTOR STRUCTURE WITH A PLATING ENHANCEMENT LAYER

BACKGROUND OF THE INVENTION

The present invention relates generally to a new semiconductor process, and more particularly, to a new semiconductor process in which a plating enhancement layer is utilized to facilitate the plating of copper.

Semiconductor device interconnection technology has made giant advancements to meet the requirements of increased device density and circuit performance. To meet the ever increasing device density demand, a double damascene method for interconnecting the semiconductor devices is widely utilized. Among other attributes of double damascene methodology, it allows the definition of a complex pattern of interconnection lines and via-studs with essentially no restriction on the number of layers of materials used in the interconnections. This feature of damascene methodology allowed the introduction of copper metallurgy which requires a variety of barrier layers and different metal deposition methods. In order to meet the improved circuit performance by reducing the parasitic impedance losses, it was soon found that a low dielectric constant (i.e., low k) dielectric material is desirable to complement the increased conductivity offered by copper metallurgy. Accordingly, low k dielectric material and copper metallurgy interconnection defined by dual damascene methodology is the present day choice for interconnections in high performance semiconductor device processing.

Electrochemical deposition of copper has been found to provide the most cost-effective manner in which to deposit a copper metallization layer. In addition to being economically viable, such a deposition technique provides substantially conformal copper films that are mechanically and electrically suitable for interconnect structures. Electrochemical deposition of copper, however, is generally only suitable for applying copper to an electrically conductive layer. As such, an underlying conductive seed layer, typically copper, is generally applied to the workpiece before it is subject to the electrochemical deposition process.

The copper seed layer is typically deposited by a physical vapor deposition (PVD) process or a variant thereof such as an ionized PVD (IPVD) process which results in non-conformal deposition which has heretofore worked well. However, as critical dimensions get smaller, for example less than 45 nm, the seed layer may pinch off the damascene openings, thereby leading to incomplete coverage and voids. To avoid this problem, the copper seed layer may be thinned or alternative seed layers such as ruthenium may be utilized. Either of these changes result in increased resistance of the metal stack, hence requiring plating tool modifications for uniform plating across the wafer without which the center of the wafer would plate substantially thinner than the edge of the wafer.

A new methodology is needed to assure uniform plating of a copper damascene interconnect structure. The present invention contemplates the use of an optically transparent and conductive plating enhancement layer such as tin oxide or indium oxide which would also serve as an etch hard mask.

The use of conductive oxides for different applications has been proposed. For example, French et al. U.S. Pat. No. 6,885,425 discloses a method of making a liquid crystal display. According to the foregoing patent, a silicon nitride layer is formed then a layer of indium tin oxide is deposited over the silicon nitride. Thereafter, the indium tin oxide is patterned to form openings and palladium followed by copper or silver is selectively deposited on the indium tin oxide and adjacent to the openings in the indium tin oxide. Others have proposed similar applications. Thus, Koh et al. U.S. Pat. No. 6,787,441 have proposed indium oxide or indium tin oxide for the electrode of semiconductors or a liquid crystal display, Mason U.S. Pat. No. 5,280,381 has proposed an electrochromic device comprising a metal oxide (e.g., tin oxide) on a support substrate, Ritchie et al. U.S. Pat. No. 4,977,013 have proposed a liquid crystal display comprising tin oxide or indium tin oxide on a polymeric substrate and Basol et al. have proposed photovoltaic devices in which there are semiconductor layers on a transparent electrically conductive layer such as indium tin oxide or tin oxide. The disclosures of all of the foregoing patents are incorporated by reference herein.

However, none of the foregoing references pertain to the uniform plating of copper damascene interconnects.

Accordingly, it is a purpose of the present invention to have a new methodology to assure uniform plating of copper damascene interconnects across the wafer.

It is another purpose of the present invention to have a plating enhancement layer that is effective in assuring uniform plating of a copper damascene interconnect structure.

These and other purposes of the invention will become more apparent after referring to the following description of the invention in conjunction with the accompanying drawings.

BRIEF SUMMARY OF THE INVENTION

The purposes of the invention have been achieved by providing a method of making a semiconductor structure, the method comprising the steps of:
  obtaining a semiconductor wafer;
  forming an interlayer dielectric (ILD) layer on the semiconductor layer;
  forming a conductive plating enhancement layer (PEL) on the ILD;
  patterning the ILD and the PEL;
  depositing a seed layer into the pattern formed by the ILD and the PEL; and
  plating copper on the seed layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
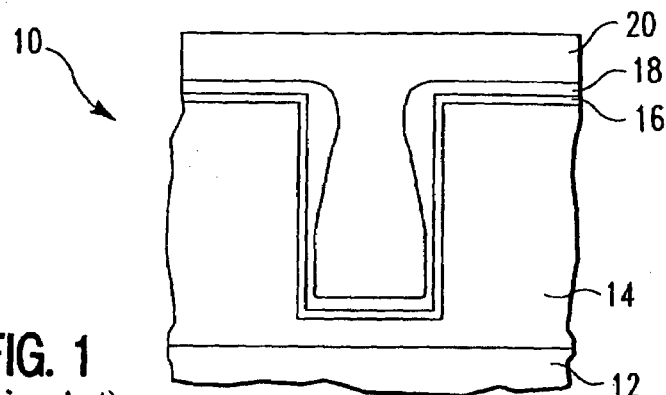
FIG. 1 is a cross sectional view of a conventional semiconductor structure.

Referring to the drawings in more detail, FIG. 1 shows a conventional semiconductor structure 10 comprising a semiconductor wafer 12 (details of the semiconductor wafer 12 are omitted for clarity) having a plurality of so-called back end of the line (BEOL) wiring levels, one of which is shown in FIG. 1. The wiring level comprises a dielectric material 14, liner or barrier layer (or layers) 16, copper seed layer 18 and electroplated copper 20.

Figure 2A:
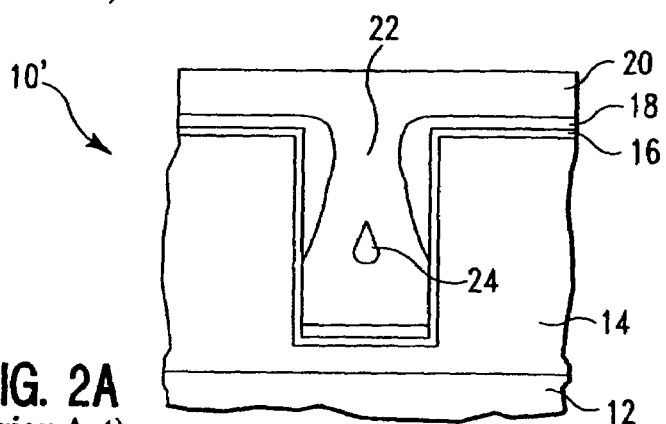
FIGS. 2A and 2B are cross sectional views of a conventional semiconductor structure having a critical dimension of about 45 nm or less and exhibiting voids as a result of the smaller critical dimension.
Figure 2B:
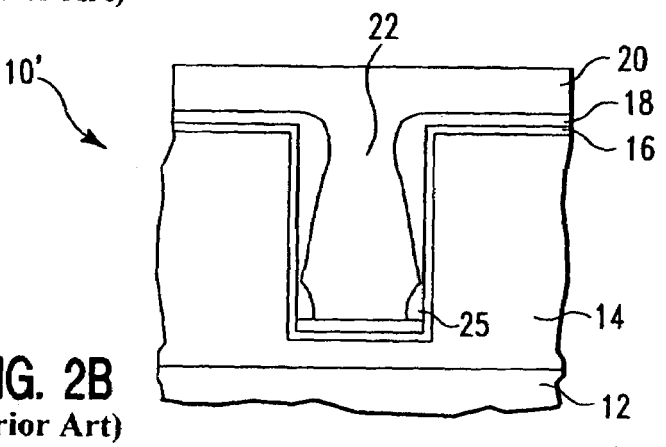

FIGS. 2A and 2B are similar to FIG. 1 except that the critical dimension of the semiconductor structure 10' is about 45 nm or less. Critical dimension means the smallest dimension that is printed for a given technology node. With the shrinking of the critical dimension, the conventional processing leads to the seed layer 18 reducing the opening 22 through which the copper is electroplated, thereby leading to voids 24 in the electroplated copper 20. In a worst case scenario, the seed layer 18 can meet and completely close off opening 22, thereby leading to no electroplated copper in the wiring feature.

In an effort to ameliorate the problem inherent in the semiconductor structure 10' shown in FIG. 2A, others have proposed depositing a thinner copper seed layer (approximately 50 Å (angstroms) thick compared to the present copper seed layer thickness of approximately 300-500 Å). However, thinning down the copper seed layer is eventually expected to lead to a break in the coverage of the copper seed layer, especially at the bottom corners of the features, leading to voids 25 shown in FIG. 2B. The thinner copper seed layer also has higher resistivity.

Figure 3:
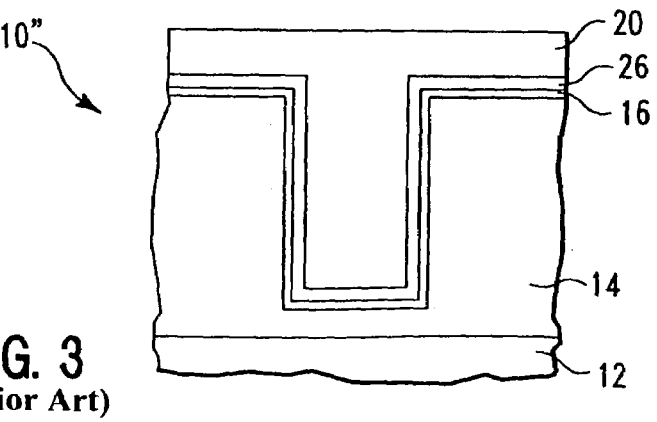
FIG. 3 is a cross sectional view of a conventional semiconductor structure having a critical dimension of about 45 nm or less and having a conformal ruthenium seed layer.
Figure 4:
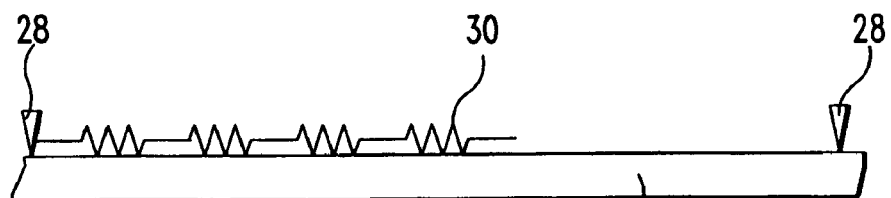
FIG. 4 is a schematic representation of the electrical resistance of a seed layer on a semiconductor wafer.

It has also been proposed, as shown in FIG. 3, to conformally deposit a ruthenium layer 26 as part of the formation of the semiconductor structure 10" in place of the copper seed layer. Ruthenium, however, has higher resistivity than copper. That is, the present PVD-deposited copper seed has a resistivity around 2.2 $\mu\Omega$-cm. whereas CVD-deposited ruthenium seed has a resistivity of around 30 $\mu\Omega$-cm. Referring now to FIG. 4, the semiconductor structure 10' or 10" is shown prior to the electroplating of the copper. The higher resistance seed layer (i.e., the thinner copper layer or ruthenium layer), schematically illustrated at 30, between the plating contacts 28 presents difficulties for the wafer level uniform electroplating of the copper. The higher resistance leads to a large voltage drop across the wafer leading to non-uniform plating thickness and/or poor plated copper texture which requires new plating tool designs and methodologies in order to be able to plate uniformly across the wafer.

Thus, a lower resistance layer would be less disruptive in the plating of the semiconductor substrate.

Figure 5:
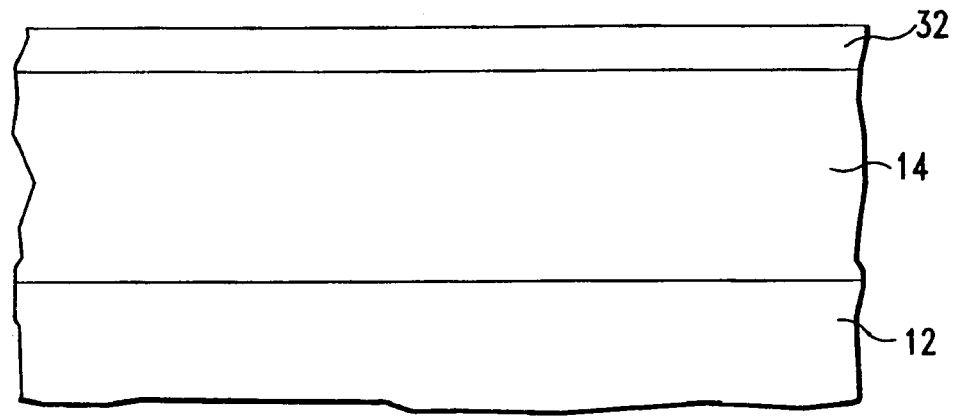
FIGS. 5 to 8 are cross sectional views of the method according to the present invention to produce a semiconductor structure with a plating enhancement layer.

Referring now to FIGS. 5 through 8, the method according to the present invention will be described. FIG. 5 illustrates the formation of a BEOL wiring level on a semiconductor wafer 12. It should be understood that there will be a plurality of such wiring levels and the processing described herein will be duplicated for each of those wiring levels. In the first steps of the process, interlayer dielectric (ILD) layer 14 is deposited directly on the semiconductor wafer 12 or on a preceding wiring level (not shown). ILD layer 14 is conventional but preferably is a low-k dielectric material. Plating enhancement layer (PEL) 32 is deposited on the ILD layer 14.

The PEL 32 is a material that is conductive to enhance conductivity of the seed layer and is optically transparent, either partially or totally, to facilitate pattern recognition with respect to prior levels. Transparent conductive oxides (TCOs), which are a very well studied class of materials with applications primarily in solar cells and flat panel displays are excellent candidates for use as a PEL. The resistivities of some candidate PEL materials are shown in the following Table I (R.G. Gordon, "Criteria for Choosing Transparent Conductors", MRS Bulletin, 25, 52 (2000)).

TABLE I

| MATERIAL | RESISTIVITY ($\mu\Omega$-cm.) |
|---|---|
| TiN | 20 |
| In$_2$O$_3$:Sn | 100 |
| Cd$_2$SnO$_4$ | 130 |
| ZnO:Al | 150 |
| SnO$_2$:F | 200 |
| ZnO:F | 400 |

Although the resistivity of the PEL materials listed in Table I is of the same order as the new seed materials such as ruthenium, the fact that the PEL material 32 can be many times thicker than the ruthenium and like materials (because the PEL 32 is never actually deposited in the patterned vias and trenches of the damascene structures) would tremendously help in reducing the resistance. The resistance of the layer(s) is what matters for plating and not the resistivity of the material itself. For example, the ruthenium seed layer for later nodes is expected to be around 30 to 80 Å. Making the ruthenium seed thicker (to reduce resistance) is not desirable as it would decrease the volume fraction of the copper in the damascene pattern and hence increase the line resistance. On the other hand, the PEL 32 according to the present invention can be as thick as 5000 Å without causing any major issues. For example, using the resistivities listed in Table I, the sheet resistance of an In$_2$O$_3$:Sn (In$_2$O$_3$ doped with tin) layer that is 350 Å thick would be less than the sheet resistance of a 100 Å ruthenium layer.

The PEL 32 would also satisfy the requirements of a RIE hardmask. As the PEL 32 is partially or totally optically transparent, the patterning of the underlying damascene structure would not be adversely affected.

The PEL most preferably should be a transparent conductive oxide. The use of such a PEL would decrease the resistance (and hence voltage drop) across the wafer and thus lead to a better wafer level plating profile. The PEL can be applied in a thickness of about 50 to 5000 Å, preferably 200 to 1500 Å, while still being optically transparent. Transparent conductive oxides thus have a clear advantage over other conductive materials which must be applied in a much thinner layer to be optically transparent. The preferred thickness depends on the PEL used. This range should cover the thickness requirement for the broad range of resistivities for the PEL candidates listed in Table I. Examples of preferred transparent conductive oxides are indium oxide (In$_2$O$_3$), tin oxide ( SnO$_2$), cadmium stannate (Cd$_2$SnO$_4$), zinc oxide (ZnO) and the doped varieties of these. There are many examples of dopants that can be found in the literature.

For example, antimony, chlorine and fluorine have been used in $SnO_2$ systems, tin in $In_2O_3$ systems, and indium, aluminum, gallium, fluorine in ZnO systems. PEL materials may be deposited by a variety of different processes. Some of the processes used in the literature for deposition of PEL materials are as follows: $In_2O_3$:Sn by spray pyrolysis and by sputtering, $SnO_2$:Sb and $SnO_2$:F by CVD, $Cd_2SnO_4$ by sputtering and by pulsed laser deposition, doped ZnO by sputtering and CVD, $Zn_2SnO_4$ and $ZnSnO_3$ by sputtering, and $Cd_2SnO_4$ by pulsed laser deposition.

Figure 6:
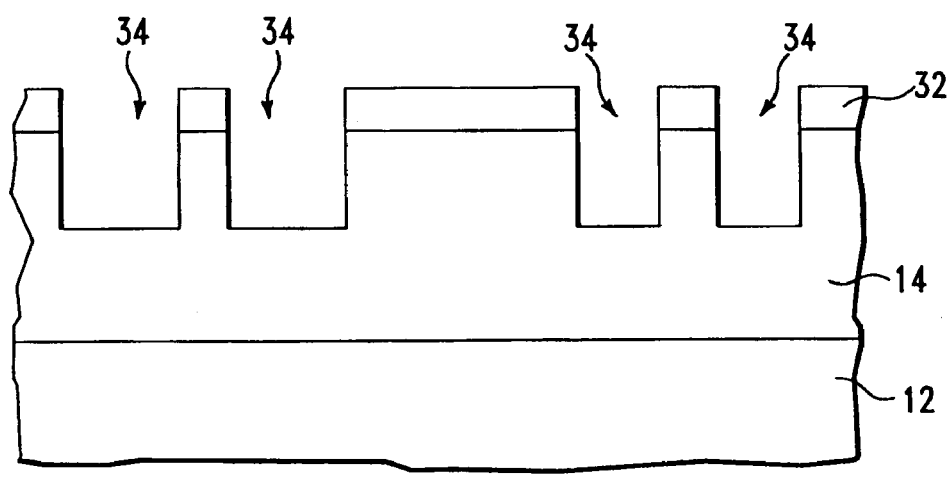

The PEL 32 and underlying ILD layer 14 are then masked and reactive ion etched using appropriate chemistries such as methane-hydrogen ($CH_4$—$H_2$) or chlorine-argon ($Cl_2$—Ar) to form features 34 as shown in FIG. 6.

Figure 7:
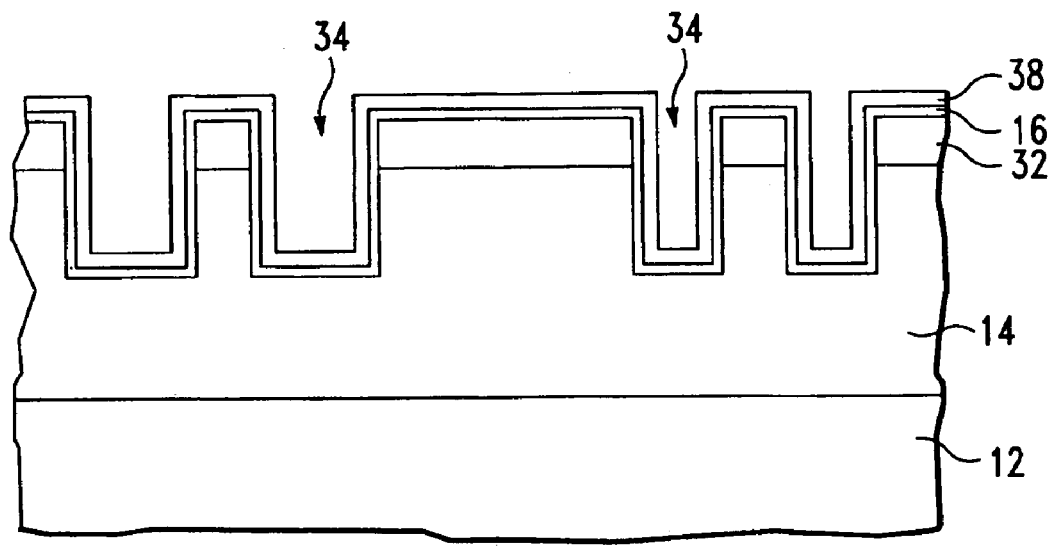

Thereafter, liner layer (or layers) 16 is conformally blanket deposited as shown in FIG. 7. The liner layer may be tantalum nitride, tantalum, titanium, titanium nitride, tungsten and combinations thereof. Included on the top of liner layer 16 is a seed layer 38 for plating. While seed layer 38 is preferably a material such as ruthenium that can be conformally deposited as a thin layer (down to 50 Å or so), semiconductor structures having a critical dimension larger than about 45 nm may also use a thinner copper seed, provided it can be deposited as a continuous layer.

Figure 8:
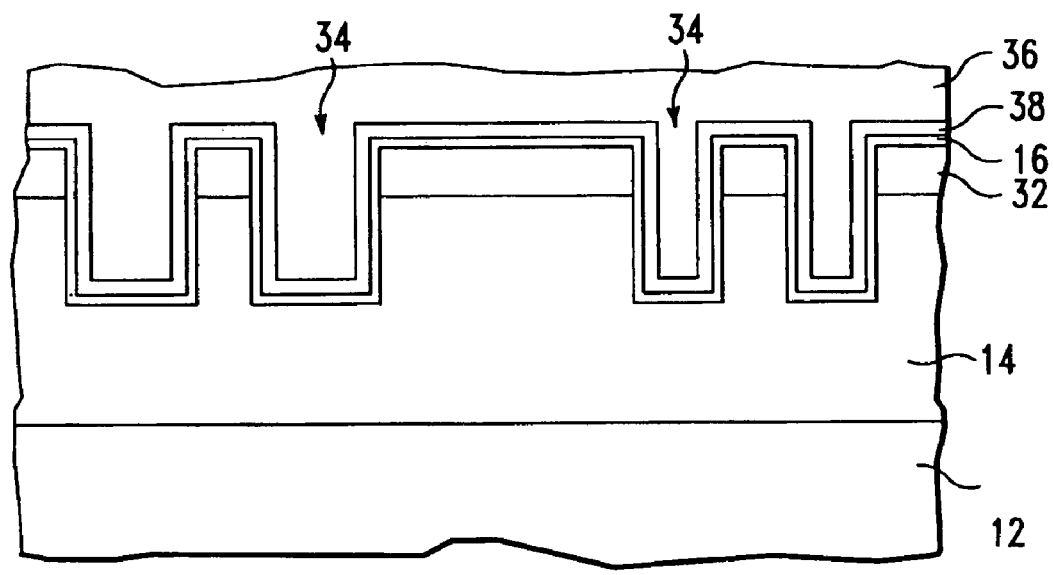

As shown in FIG. 8, copper 36 is electroplated over liner layer 16 and copper seed layer 38 and into the features 34.

Figure 9A:
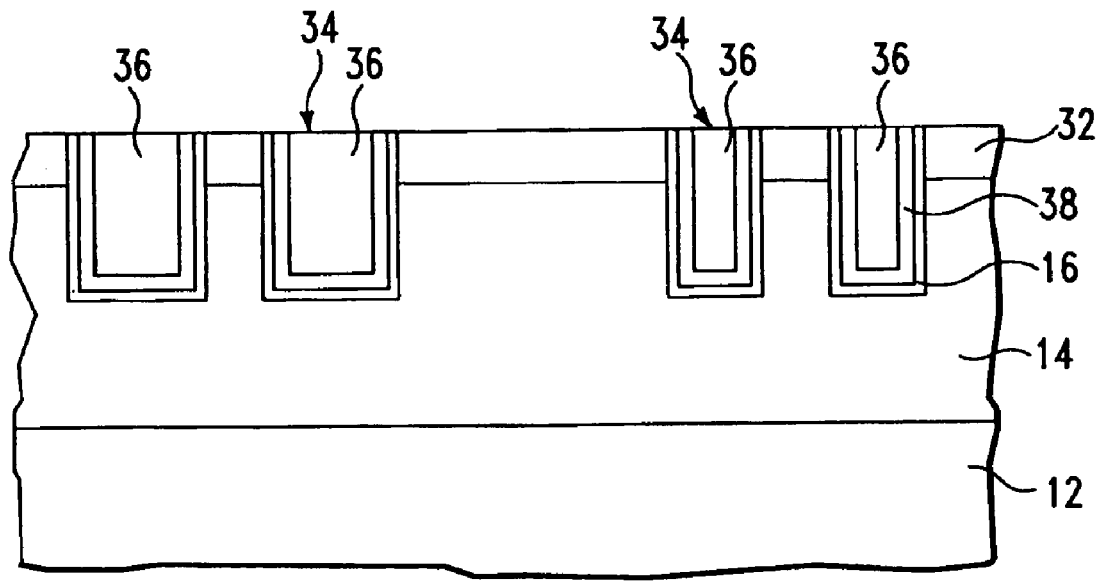
FIG. 9A is a cross sectional view of the semiconductor structure in FIG. 8 after a first embodiment of planarization down to the plating enhancement layer.
Figure 9B:
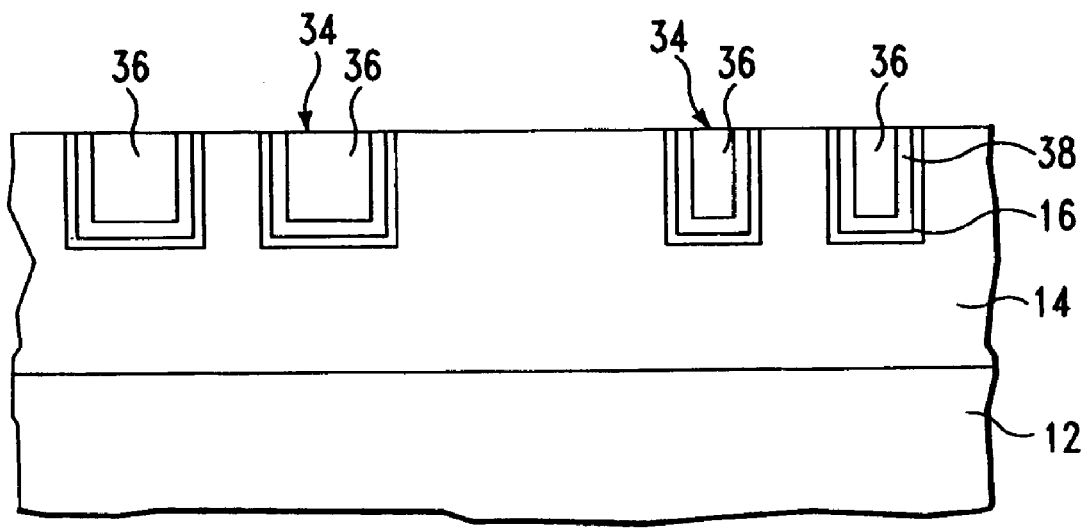
FIG. 9B is a cross sectional view of the semiconductor structure in FIG. 8 after a second embodiment of planarization down to the dielectric layer.

Thereafter, the semiconductor structure is planarized, either down to the PEL 32 as shown in FIG. 9A or the ILD layer 14 shown in FIG. 9B. The planarizing may be conducted by any planarizing technique but is preferably done by chemical-mechanical polishing.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of making a semiconductor structure, the method comprising the steps of:
   obtaining a semiconductor wafer;
   forming an interlayer dielectric (ILD) layer on the semiconductor wafer;
   forming a conductive plating enhancement layer (PEL) on the ILD;
   patterning the ILD and the PEL and removing a section of the PEL and at least a portion of the ILD;
   depositing a seed layer into the pattern formed by the ILD and the PEL; and
   plating copper on the seed layer.

2. The method of claim 1 wherein the PEL is optically transparent.

3. The method of claim 1 wherein the PEL comprises a transparent conductive oxide.

4. The method of claim 3 wherein the transparent conductive oxide is selected from the group consisting of indium oxide, tin oxide, cadmium stannate, zinc oxide and combinations thereof.

5. The method of claim 3 wherein the transparent conductive oxide is selected from the group consisting of doped indium oxide, doped tin oxide, doped cadmium stannate, doped zinc oxide and combinations thereof.

6. The method of claim 1 further comprising the step, prior to the step of depositing a seed layer, of depositing a liner layer into the pattern formed by the ILD and the PEL.

7. The method of claim 6 wherein the liner layer comprises a material selected from the group consisting of tantalum nitride, tantalum, titanium, titanium nitride, tungsten and combinations thereof.

8. The method of claim 1 further comprising the step of planarizing the copper down to the PEL.

9. The method of claim 8 wherein the step of planarizing comprises chemical-mechanical polishing.

10. The method of claim 1 further comprising the step of planarizing the copper down to the ILD.

11. The method of claim 10 wherein the step of planarizing comprises chemical-mechanical polishing.

12. The method of claim 1 wherein the thickness of the PEL is 50 Å to 5000 Å.

13. The method of claim 1 wherein the thickness of the PEL is 200 Å to 1500 Å.

14. A method of making a semiconductor structure, the method comprising the steps of:
   obtaining a semiconductor wafer;
   forming an interlayer dielectric (ILD) layer on the semiconductor wafer;
   blanket depositing a conductive plating enhancement layer (PEL) on the ILD;
   patterning the ILD and the PEL and removing a section of the PEL and at least a portion of the ILD so as to form features in the ILD and the PEL;
   blanket depositing a seed layer onto the PEL and into the features formed in the ILD and the PEL; and
   plating copper on the seed layer.

15. The method of claim 14 wherein the PEL is optically transparent.

16. The method of claim 14 wherein the PEL comprises a transparent conductive oxide.

17. The method of claim 16 wherein the transparent conductive oxide is selected from the group consisting of indium tin oxide, indium oxide, tin oxide, cadmium stannate, zinc oxide and combinations thereof.

18. The method of claim 16 wherein the transparent conductive oxide is selected from the group consisting of doped indium tin oxide, doped indium oxide, doped tin oxide, doped cadmium stannate, doped zinc oxide and combinations thereof.

19. The method of claim 14 wherein the thickness of the PEL is 50 Å to 5000 Å.

20. The method of claim 14 wherein the thickness of the PEL is 200 Å to 1500 Å.

* * * * *